United States Patent [19]

Lin

[11] Patent Number: 4,755,748
[45] Date of Patent: Jul. 5, 1988

[54] METHOD AND APPARATUS FOR ANALYZING SEMICONDUCTOR DEVICES USING CHARGE-SENSITIVE ELECTRON-BEAM-INJECTED-CARRIER MICROSCOPY

[75] Inventor: Paul S. D. Lin, Murray Hill, N.J.

[73] Assignee: Bell Communications Research, Inc., Livingston, N.J.

[21] Appl. No.: 741,590

[22] Filed: Jun. 5, 1985

[51] Int. Cl.[4] .............................................. G01R 31/28
[52] U.S. Cl. .............................. 324/158 R; 324/73 R; 324/158 D
[58] Field of Search .............. 324/158 R, 158 D, 71.3, 324/73 PC, 73 R; 250/310, 311

[56] References Cited

U.S. PATENT DOCUMENTS

| | | | |
|---|---|---|---|
| T 930,006 | 1/1975 | Beaufrere et al. | 324/51 |
| 3,549,999 | 12/1970 | Norton | 324/158 |
| 3,678,384 | 7/1972 | Datley | 324/158 |
| 3,984,690 | 10/1976 | Marshall, III et al. | 250/374 |
| 4,255,659 | 3/1981 | Kaufman et al. | 378/19 |
| 4,296,372 | 10/1981 | Feuerbaum | 324/71 |
| 4,333,051 | 6/1982 | Goodman | 324/158 |
| 4,387,304 | 6/1983 | Younkin | 250/492 |
| 4,393,348 | 7/1983 | Goldstein et al. | 324/158 |
| 4,413,181 | 11/1983 | Feuerbaum | 250/310 |
| 4,415,237 | 11/1983 | Fox | 250/336.1 |
| 4,433,288 | 2/1984 | Moore | 324/158 |
| 4,464,627 | 8/1984 | Munakata et al. | 324/158 |
| 4,477,775 | 10/1984 | Fazekas | 324/158 |
| 4,580,057 | 4/1986 | Sidhwa | 250/392 |
| 4,588,950 | 5/1986 | Henley | 324/158 T |
| 4,644,264 | 2/1987 | Beha et al. | 324/158 R |

OTHER PUBLICATIONS

Jowett, C. E.; "Surface Analytical . . . "; Microelectronics Journal; Mar.–Apr. 1980; pp. 35–40.
"Intergrated Circuit Inspection," Kresge et al., IBM Technical Disclosure Bulletin, vol. II, No. 7, Dec. 1968 p. 813.
"MOS Flat-Band Voltage Measurement," Yun, IBM Technical Disclosure Bulletin, vol. 14, No. 6, Nov. 1971, p. 1732.

Primary Examiner—Ernest F. Karlsen
Attorney, Agent, or Firm—James W. Falk; Stephen M. Gurey

[57] ABSTRACT

In order to determine whether defects are present in a semiconductor device (103) biased to its normal operating levels, a scanning electron microscope (101) equipped with an electron beam blanker (102) scans the device with a pulsed electron beam. Charge carriers generated within the device in response to each pulse of electrons are collected and amplified by a charge carrier sensitive preamplifier (114) to produce a voltage signal which when applied to a CRT (118) produces an image of the semiconductor. Defects in the device can be located from irregularities in the image and the presence of bias dependent defects can be ascertained by varying the bias current supplied (113) to the device and noting changes in the image.

2 Claims, 2 Drawing Sheets

METHOD AND APPARATUS FOR ANALYZING SEMICONDUCTOR DEVICES USING CHARGE-SENSITIVE ELECTRON-BEAM-INJECTED-CARRIER MICROSCOPY

BACKGROUND OF THE INVENTION

This invention relates to the detection of defects in semiconductor materials and devices.

Electron beam induced current, also known as electron beam injected carriers (EBIC) microscopy is a known analysis tool for detecting defects or junction integrity in semiconductor devices such as lasers, photodiodes, photodetectors, FETS, and MOS devices. In the prior art, a scanning electron microscope (SEM) irradiates the semiconductor device under observation with an electron beam which produces electron-hole pairs within the device. By detecting the signal induced in the semiconductor in response to the incident beam as it scans the semiconductor device and using the induced signal to modulate the signal intensity on a cathode ray tube (CRT) an image of the semiconductor device is derived from which material properties and/or defects of the device can be observed.

Prior art methods and apparatus for detecting the signal induced in the device in response to an incident electron beam have employed a current sensitive preamplifier or voltage sensitive preamplifier to detect the induced current or voltage, respectively. The voltage output of either type of preamplifier has then been used to modulate the intensity of a CRT video signal on a one-to-one linear relationship with the induced signal as the beam scans the device. Disadvantageously, semiconductor devices biased at their normal operating bias current levels could not be examined since the bias current would also be fed to the preamplifier and overwhelm the induced signal. Since certain material and/or manufacturing defects are bias dependent, these defects could not be readily detected using these prior art techniques. Furthermore, alternative prior art techniques for analyzing biased semiconductor devices have provided unsatisfactory results. In one arrangement, the bias current is blocked from the current sensitive preamplifier by means of an ac coupling capacitor. However, the resultant output of the preamplifier will no longer be proportional to the induced current thereby making detection of defects difficult. In a second arrangement, dc offset current at the input of the preamplifier is used to offset the bias current through the device. The offset current will not however offset the noise associated with the bias current and the resultant image derived from the preamplifier output is a noisy representation of the device from which defects cannot be readily detected.

Another problem associated with these prior art defect detection techniques is that they cannot be used for defect detection of MOS type devices which are a large percentage of semiconductor devices presently being manufactured. In particular, the magnitude of the irradiating electron beam causes holes to be trapped within the oxide layer of MOS devices thereby inducing a threshold shift which modifies the device behavior. In order to remove these modifications, a high-temperature annealing process must be performed on the modified MOS device.

SUMMARY OF THE INVENTION

The aforedescribed problems associated with the prior art techniques for detecting defects in semiconductor devices are eliminated by the method and apparatus of the present invention. In accordance with the present invention a charge-sensitive preamplifier is employed to produce an output signal proportional to the number of charge carriers in the semiconductor device collected in response to a pulsed scanning and irradiating electron beam. With such an arrangement the semiconductor device may be biased at its operating levels and correlations between electrically active microscopic defects and device performance can be established and the behavior of junctions under various bias conditions can be studied. Furthermore, defects in semiconductor devices which are only detectable when the device is biased can be located. In addition, the total radiation incident upon a MOS device can be limited below its maximum tolerable dosage by controlling the number of irradiating electrons per pulse to permit detection of material and/or manufacturing defects therein.

DETAILED DESCRIPTION

Figure 1:
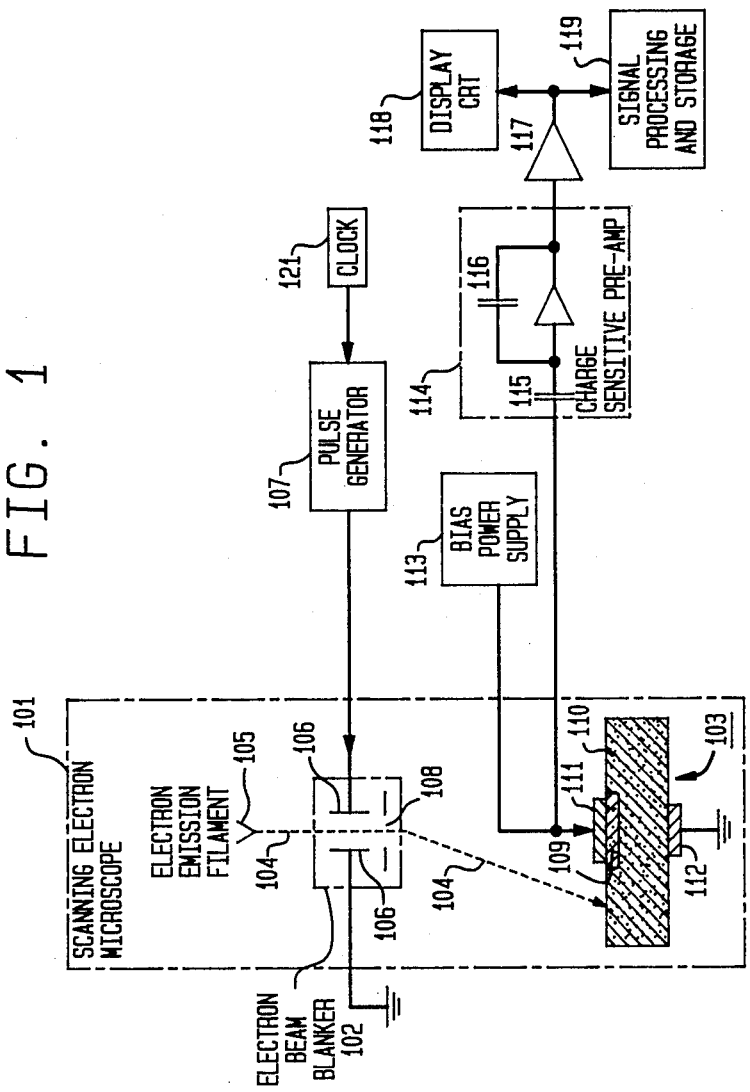
FIG. 1 is a block diagram of apparatus used to detect defects in semiconductor devices in accordance with the present invention.

In conventional electron-beam-injected-carriers microscopy an irradiating electron beam is scanned across a semiconductor device to generate within the device electron-hole pairs. These carriers, in the absence of an electric field diffuse through the device but in the presence of a field drift under its influence. Thus, in the presence of a junction within the device, the carriers diffuse towards the junction where they are separated by the junction field. This motion of carriers within the device induces in external circuits a signal which in the prior art is proportional to either the total current or voltage generated by the incident beam. As the beam scans the device therefore, the induced signal reaches maximum intensity when the beam is directly incident upon the junction since the generated carriers are immediately collected at the junction are not lost to diffusion.

The induced signal when detected and amplified, is inputted to a CRT where it modulates the video signal to generate an image of the semiconductor device. The image generated from a device free from material and/or manufacturing defects has a uniformly bright intensity across the entire junction and a uniformly dark intensity in areas removed from the junction. Material and/or manufacturing defects produce deviations in the expected induced signal output and thus in the displayed image. Thus, by either visually examining the resultant CRT image or processing the signal, defects within the semiconductor device under observation can be located.

Semiconductor devices are subject to various type of material and/or manufacturing defects which may affect the performance of the device. For example, a pinhole diffusion through the film layers during fabrication of the device will create a miniature junction. Such a defect will become detectable when the device is biased and the width of the main pn junction extends to reach the isolated diffused deposits so that the miniature diode becomes active. Such a defect would not be detectable using conventional current or voltage modes. Also, localized high voltage in the device can result from a manufacturing defect or improper handling to create an extra breakdown site and a "microplasma" in the image. These types of defects create abnormal fields within the device which increase the number of carriers drifting towards them. Alternatively, impurity contaminated regions within a semiconductor device caused by material defects create recombination centers which cause carriers to recombine prior to collection by the junction.

All material and/or manufacturing defects are likely to affect the characteristics and thus performance of the device depending upon their location within the device. In order to determine whether any of these defects will affect the characteristics and performance of the device, the device must be examined under its operating bias conditions to correlate the occurrence and location of any defects with the bias voltage which conventional prior art arrangements were unable to do.

With reference to FIG. 1, an arrangement is shown for examining semiconductor devices that are biased at their operating levels. A scanning electron microscope (SEM) 101 containing an electron beam blanker 102 irradiates and scans a semiconductor device 103 under observation with a beam of electrons 104 in a conventional manner. SEM 101 contains an electron emission filament 105 which generates at high voltages the electron beam 104. Beam 104 passes through deflection plates 106 and aperture 108 within beam blanker 102. A pulse signal applied across deflection plates 106 causes the electron beam 104 to pulse on and off at each spatial location upon the surface of the device 103. This pulse signal applied to deflection plates 106 is generated by a pulse generator 107 which in turn is controlled in rate by a clock 121.

For illustrative purposes the particular semiconductor device 103 under observation includes a circular p-type region 109 fabricated by diffusion into a n-type region 110. A circular metal contact 111 having a diameter less than the diameter of region 109 is affixed to p-type region 109 and a metal contact 112 is affixed to n-type region 110 and to ground potential. A bias power supply 113 such as a Keithley 225 constant current source provides a dc bias current to semiconductor device 103.

As the electron beam 104 scans device 103 electron-hole pairs are produced which diffuse through the device and induce a signal which can be externally detected. When the beam 104 is incident near the junction between the p-type and n-type materials, the induced signal is a maximum due to increased movement of the electrons under the influence of the junction field. When the incident beam 104 is further away from the junctions, the induced signal is small due to the lack of influence of a field upon the electron-hole pairs. As aforedescribed, manufacturing or material defects that create abnormal fields are detected by the abnormal magnitude of the induced signal when the electron beam is incident thereon.

In accordance with the invention a charge carrier sensitive preamplifier 114 connected to contact 111 is employed to detect the number of charge carriers collected due to the irradiating pulsed electron beam 104. Preamplifier 114 could be one of several commercially available charge-sensitive preamplifier/pulse shaping amplifier hybrids such as an AMPTEK A-203. Preamplifier 114 includes a coupling capacitor 115 and feedback capacitor 116. The preamplifier functions as an integrator to each current pulse generated due to the collection of carriers generated by each pulse of electrons in the incident pulsed electron beam 104. In particular, the output voltage is linearly related to the number of collected charge carriers Q per pulse by the relationship $-Q/C_f$ where $C_f$ is the value of feedback capacitor 116. Since coupling capacitor 115 blocks the dc components, preamplifier 114 is insensitive to the magnitude of the bias current through device 103 from bias power supply 113 and is sensitive only to the ac variations induced by the pulsing electron beam 104. The rate of pulsing is determined by signal-to-noise considerations and the pulse-on time must be long enough for sufficient carriers to be generated within the device and be collected. The pulse rate is typically in the range of 3 KHz to 2 MHz.

The output of preamplifier 114 is connected to a low noise main amplifier 117 such as an Ithaco 1201 amplifier which serves to amplify the output from preamplifier 114 with a voltage gain of 10 to 1000. The amplified output of amplifier 117 modulates the intensity of the video signal on a CRT 118 from which the image of semiconductor device 103 generated in response to the incident beam 104 can be visually analyzed. Alternatively, the output of amplifier 117 can be inputted to a signal processing and storage device 119 such as a Tracor Northern Model 5500 image processor for processing, storage, and/or analysis.

As aforenoted, prior art current sensitive or voltage sensitive methods could not be applied to test MOS devices because of the device destructive effect due to the intensity of the incident beam required to generate a response that is detectable over the background noise. Whereas the voltage or current sensitive methods require a preamplifier having noise generating resistive input and feedback impedances, charge sensitive preamplifier 114 has purely reactive input impedance 115 and feedback impedance 116. With the noise sources eliminated, the magnitude of the electron beam current can be reduced so that the total incident radiation is less than the maximum device tolerable radiation dosage. For example, if a pulsed beam at 25 kv containing 14 electrons per pulse scans a 100×100 square micron area with 500 elements per scan line, the dosage is 0.006 Mrad for a single scan which is less than the typical 1 Mrad maximum radiation dosage which radiation hardened devices can tolerate. Although the image of a MOS device irradiated with a low dosage electron beam will be noisier than the image a non-MOS semiconductor device irradiated with a high-dosage incident beam, signal processing employing filter algorithms can reduce the noise to enable detection of device defects.

Figure 2:
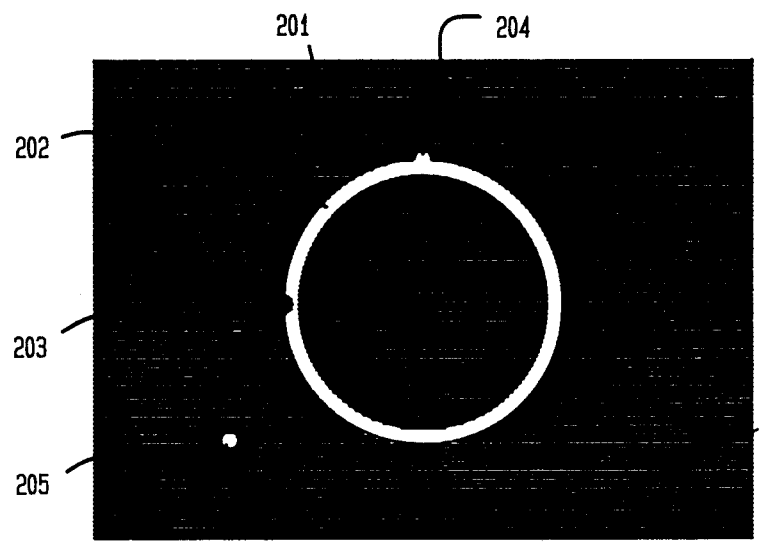
FIG. 2 is a CRT micrograph image of a semiconductor device generated by the apparatus of FIG. 1 showing the presence of material and manufacturing defects.

With reference to FIG. 2, a CRT micrograph image of semiconductor device 103 generated by the apparatus in FIG. 1 is shown having several of the types of material and manufacturing defects that could be present. As can be noted, the pn junction between p-type region 109 and n-type region 110 appears as an essentially ring-shaped region 201 in the image; the ring-shaped image resulting from the diameter difference between the impenetrable metal contact 111 and the p-type region 109. As heretofore described, semiconductor devices are subject to various material and/or manufacturing defects. For example, a recombination center caused by a material impurity can be detected by noting areas of increased darkness, 202 and 203. If the recombination center is near the junction (203) then its presence will have a deleterious effect on the device characteristics. Similarly, a pinhole diffusion in the manufacturing process may cause extra junction which can be observed in the image as an extra bright spot 204 along the junction which can affect performance. Also, an extra breakdown site caused by a localized high voltage due to a manufacturing or handling defect will result in an extra bright spot or "microplasma" 205 in the image. Many of these types of defects will only be observable under certain bias conditions. Thus, by studying the images of the device as it is biased at various bias current levels by varying the output of bias power supply 113, the behavior of the device under normal operating conditions can be observed to determine whether the semiconductor device is defective.

The above described embodiment is illustrative of the principles of the present invention. Other embodiments may be devised by those skilled in the art without departing from the spirit and scope of the invention.

What is claimed is:

1. A method for detecting defects in a semiconductor device comprising the steps of:

biasing the semiconductor with a variable bias current, scanning the biased device with an electron beam that is pulsed on and off at each spatial point on the surface of the device, collecting charge carriers generated in the device in response to each pulse at each spatial point to a substantially proportional voltage, forming an image of the device from the voltage levels associated with each spatial point, and analyzing said image for irregularities to determine and locate defects in the device.

2. Apparatus for detecting defects in a semiconductor device scanned by an electron beam of a scanning electron microscope, the microscope being equipped with an electron beam blanker comprising:

means for biasing the semiconductor with a variable bias current, pulsing means for pulsing the electron beam on and off at a predetermined rate as the beam scans each spatial point on the surface of the device, means for collecting charge carriers generated in the device in response to each pulse of the pulsed electron beam, means for converting the number of charge carriers collected in response to each pulse at each spatial point to a substantially proportional voltage level, and means for generating an image of the device from the voltage levels associated with each spatial point.

* * * * *